United States Patent [19]
Obiya et al.

[11] Patent Number: 5,776,995
[45] Date of Patent: Jul. 7, 1998

[54] PHOTOSENSITIVE RESIN COMPOSITION AND PHOTOSENSITIVE RESIN LAMINATED FILM CONTAINING THE SAME

[75] Inventors: Hiroyuki Obiya; Ryuma Mizusawa, both of Kanagawa, Japan

[73] Assignee: Tokyo Ohka Kogyo Co., Ltd., Kanagawa, Japan

[21] Appl. No.: 738,079

[22] Filed: Oct. 25, 1996

[30] Foreign Application Priority Data

Oct. 27, 1995 [JP] Japan ............... 7-303921
Nov. 30, 1995 [JP] Japan ............... 7-336217

[51] Int. Cl.$^6$ ............... C08F 2/46; C08F 2/50; C08L 75/16
[52] U.S. Cl. ............... 522/15; 522/18; 522/31; 522/32; 522/33; 522/88; 522/90; 522/95; 522/97; 522/117; 522/137
[58] Field of Search ............... 522/31, 15, 18, 522/95, 96, 97, 88, 117, 137, 32, 33, 90

[56] References Cited

U.S. PATENT DOCUMENTS

| | | | |
|---|---|---|---|
| 4,430,416 | 2/1984 | Goto et al. | 430/263 |
| 4,587,186 | 5/1986 | Nakamura et al. | 430/14 |
| 4,849,321 | 7/1989 | Hung et al. | 522/96 |
| 4,855,077 | 8/1989 | Shikinami et al. | 252/518 |
| 5,102,774 | 4/1992 | Settachayanon | 522/97 |
| 5,155,143 | 10/1992 | Koleske | 522/170 |

FOREIGN PATENT DOCUMENTS

| | | | |
|---|---|---|---|
| 0130559 | 1/1985 | European Pat. Off. | B44C 1/22 |
| 0674225 | 9/1995 | European Pat. Off. | G03F 7/027 |
| 0741332 | 11/1996 | European Pat. Off. | |
| 6161097 | 6/1994 | Japan | |

Primary Examiner—Susan W. Berman
Attorney, Agent, or Firm—Sughrue, Mion, Zinn, Macpeak & Seas, PLLC

[57] ABSTRACT

A photosensitive resin composition comprising the following components (A), (B) and (C): (A) a photopolymerizable urethane (meth)acrylate compound containing at least two acryloyl or methacryloyl groups, (B) an alkali-soluble polymer compound having an acid value of from 50 to 250 mgKOH/g, and (C) a photopolymerization initiator, wherein the photosensitive resin composition has an electrical insulation resistance of $8.0 \times 10^9$ to $1.0 \times 1.0^{14}$ Ω·cm after photocuring. A photosensitive resin laminated film comprising a flexible film, a photosensitive layer provided on the flexible film, and a releasable film layer provided on the photosensitive layer, wherein the photosensitive layer comprises the above photosensitive resin composition.

18 Claims, 2 Drawing Sheets

5,776,995

1

PHOTOSENSITIVE RESIN COMPOSITION AND PHOTOSENSITIVE RESIN LAMINATED FILM CONTAINING THE SAME

FIELD OF THE INVENTION

The present invention relates to a novel photosensitive resin composition and a photosensitive resin laminated film having a photosensitive layer comprising the photosensitive resin composition. More particularly, a photosensitive resin composition and a photosensitive resin laminated film having a photosensitive layer comprising the photosensitive resin composition which are highly elastic and flexible, have excellent alkali developability and satisfactory adhesion to bases, and are free from an electrostatic discharge or thunderbolt during sandblasting.

BACKGROUND OF THE INVENTION

Sandblasting is one of the conventionally known processing methods for forming designs on the surface of glass, marble, plastic, ceramic, leather, wooden, and other bases. In general, such engraving for forming a design is carried out either by sandblasting in which a sandblast resist is formed on the surface of a base and the exposed parts not covered with the resist are selectively abraded by blowing an abrasive material or the like against those parts, or by etching with a reagent. In particular, the sandblasting technique in which a mask pattern is formed from a photosensitive resin layer as a sandblast resist by photolithography and selective abrasion is conducted by blowing an abrasive material or the like or the engraving technique based on etching with a reagent is used as a fine processing technique in the formation of a circuit board where a metal pattern and an insulation pattern are coexist, especially in plasma display fabrication for forming a metal wiring pattern and an insulation pattern made of a ceramic, a phosphor, and the like. The photosensitive resin compositions for use in the precision sandblasting are required not only to give cured resin compositions which have sufficient sandblasting resistance to prevent a mask damage by sandblasting, but also to be easily developed with a weakly alkaline aqueous solution after pattern-wise exposure and to pose no problem concerning the working atmosphere, wastewater treatment, and the like. Moreover, the photocured resin compositions are required to be free from base damages caused by a discharge or thunderbolt resulting from static build-up or static electricity generated by friction with fine abrasive particles during sandblasting, e.g., spotting, chipping, or cracking in glass or marble bases and short-circuiting in circuit boards resulting from wiring pattern or insulation layer damages. Photosensitive resin compositions for sandblast resist which are intended to meet such requirements have been proposed. For example, a photosensitive resin composition comprising an unsaturated polyester, an unsaturated monomer, and a photopolymerization initiator is disclosed in JP-A-55-103554 (the term "JP-A" as used herein means an "unexamined published Japanese patent application"), and a photosensitive resin composition comprising poly(vinyl alcohol) and a diazo resin is disclosed in JP-A-2-69754.

However, the photosensitive resin compositions for sandblast resist described above have drawbacks in that they are susceptible to static build-up, although excellent in sandblasting resistance and other properties. Therefore, when those compositions were used to conduct fine processing, the accumulated static electricity caused a discharge or thunderbolt to damage the base. In particular, in the formation of a circuit board, the discharge or thunderbolt causes unrepairable defects in the wiring pattern or insulation layer, and this often results in the occurrence of defectives.

SUMMARY OF THE INVENTION

An object of the present invention is to provide a photosensitive resin composition which is highly elastic and flexible, has excellent alkali developability and satisfactory adhesion to bases, and is free from a base damage caused by a discharge or thunderbolt during sandblasting.

Another object of the present invention is to provide a photosensitive resin laminated film having a layer comprising the above-described photosensitive resin composition.

These and other objects of the present invention have been attained by a photosensitive resin compositiion comprising the following components (A), (B) and (C):

(A) a photopolymerizable urethane (meth)acrylate compound containing at least two acryloyl or methacryloyl groups, (B) an alkali-soluble polymer compound having an acid value of from 50 to 250 mgKOH/g, and (C) a photopolymerization initiator, wherein said photosensitive resin composition has an electrical insulation resistance of $8.0 \times 10^9$ to $1.0 \times 10^{14}$ $\Omega \cdot$cm after photocuring.

Furthermore, these and other objects of the present invention have been attained by a photosensitive resin laminated film comprising a flexible film, a photosensitive layer provided on said flexible film, and a releasable film layer provided on said photosensitive layer, wherein said photosensitive layer comprises the above-described photosensitive resin composition.

BRIEF EXPLANATION OF THE INVENTION

DETAILED DESCRIPTION OF THE INVENTION

Figure 1:
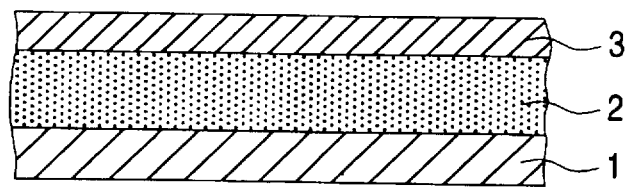
FIG. 1 is an enlarged sectional view of a photosensitive resin laminated film according to the present invention.

Under these circumstances, the present inventors made intensive studies in order to eliminate the problems described above. As a result, it has been found that when the above-described photosensitive resin composition is used, the photocured composition is less susceptible to static build-up during sandblasting and does not cause a damage attributable to a discharge or thunderbolt. In particular, it has been found that when a Lewis acid salt which is soluble in an organic solvent and generates a Lewis acid upon light irradiation is added to the above photosensitive resin composition, an electrical insulation resistance within the specific range can be easily attained and the occurrence of a discharge, thunderbolt, or the like can be completely prevented. It has further been found that a photosensitive laminated film for sandblasting which facilitates a precision processing is obtained by forming a layer of the above photosensitive resin composition for sandblasting on a flexible film. The present invention has been completed based on these findings.

The photopolymerizable urethane (meth)acrylate compound of component (A) in the present invention having at least two acryloyl or methacryloyl groups is a product by the reaction of a hydroxylated (meth)acrylate compound with a compound having a terminal isocyanate group (-NCO group) obtained by reacting a diol compound with a diisocyanate compound. Examples of the diol compound include hydroxy-terminated polyesters and polyethers. Examples of the polyesters include polyesters formed by the ring-opening polymerization of lactones, polycarbonates, and polyesters provided by the condensation reaction of an alkylene glycol (e.g., ethylene glycol, propylene glycol, diethylene glycol, triethylene glycol, dipropylene glycol) with a dicarboxylic acid (e.g., maleic acid, fumaric acid, glutaric acid, adipic acid). Especially preferred are polyesters provided by the ring-opening polymerization of lactones and polycarbonates because these polyesters have a low insulation resistance and are less apt to cause a discharge during sandblasting. Examples of the lactones include δ-valerolactone, ε-caprolactone, β-propiolactone, α-methyl-β-propiolactone, β-methyl-β-propiolactone, α,α-dimethyl-β-propiolactone, and β,β-dimethyl-β-propiolactone. Examples of the polycarbonates include products of the reaction of a diol (e.g., bisphenol A, hydroquinone, dihydroxycyclohexane) with a carbonyl compound (e.g., diphenyl carbonate, phosgene, succinic anhydride).

Examples of the polyethers include polyethylene glycol, polypropylene glycol, polytetramethylene glycol, and polypentamethylene glycol. The polyesters and polyethers enumerated above may have a structure containing a residue of 2,2-bis(hydroxymethyl)propionic acid, 2,2-bis(2-hydroxyethyl)propionic acid, or 2,2-bis(3-hydroxypropyl) propionic acid, in particular a residue of 2,2-bis (hydroxymethyl)propionic acid; such polyesters and polyethers are advantageous in that urethane compounds having excellent solubility in alkali solutions can be synthesized therefrom. Those polyesters or polyethers may be used either alone or as a mixture of two or more thereof.

Examples of the diisocyanate compound reacted with the diol compound include aliphatic or alicyclic diisocyanate compounds, such as dimethylene diisocyanate, trimethylene diisocyanate, tetramethylene diisocyanate, pentamethylene diisocyanate, hexamethylene diisocyanate, heptamethylene diisocyanate, 2,2-dimethylpentane 1,5-diisocyanate, octamethylene diisocyanate, 2,5-dimethylhexane 1,6-diisocyanate, 2,2,4-trimethylpentane 1,5-diisocyanate, nonamethylenediisocyanate, 2,2,4-trimethylhexanediisocyanate, decamethylene diisocyanate, and isophorone diisocyanate. These compounds may be used alone or as a mixture of two or more thereof.

Examples of the hydroxylated (meth)acrylate compound include hydroxymethyl acrylate, hydroxymethyl methacrylate, 2-hydroxyethyl acrylate, 2-hydroxyethyl methacrylate, 3-hydroxypropyl acrylate, 3-hydroxypropyl methacrylate, ethylene glycol monoacrylate, ethylene glycol monomethacrylate, glycerol acrylate, glycerol methacrylate, dipentaerythritol monoacrylate, and dipentaerythritol monomethacrylate. These compounds may be used alone or as a mixture of two or more thereof.

The urethane (meth)acrylate compound which is a reaction product obtained from the ingredients described above preferably has an average molecular weight of from 1,000 to 10,000. Average molecular weights thereof lower than 1,000 are undesirable in that the cured film has enhanced bonding strength and increased hardness and hence has reduced sandblasting resistance. Average molecular weights thereof exceeding 10,000 are undesirable in that not only the composition has poor coating film properties and impaired workability because of an increase in viscosity, but also the cured film has an increased electrical insulation resistance. Although the urethane (meth)acrylate compound may contain a carboxyl group, the acid value thereof is desirably 70 mgKOH/g or lower, preferably from 20 to 50 mgKOH/g.

The alkali-soluble polymer compound of component (B) contained in the photosensitive resin composition of the present invention is preferably a copolymer of acrylic or methacrylic acid, a carboxylated cellulosic resin, or the like. Component (B) has an acid value of from 50 to 250 mgKOH/g, preferably from 80 to 200 mgKOH/g. If the acid value thereof is lower than 50 mgKOH/g, development failure may result. If the acid value thereof exceeds 250 mgKOH/g, the cured film has poor flexibility and impaired water resistance.

Examples of comonomers usable for producing tile acrylic or methacrylic acid copolymer include fumaric acid, maleic acid, crotonic acid, cinnamic acid, methyl acrylate, methyl methacrylate, ethyl acrylate, ethyl methacrylate, butyl acrylate, butyl methacrylate, isobutyl acrylate, isobutyl methacrylate, monomethyl fumarate, monoethyl fumarate, monopropyl fumarate, monomethyl maleate, monoethyl maleate, monopropyl maleate, sorbic acid, hydroxymethyl acrylate, hydroxymethyl methacrylate, 2-hydroxyethyl acrylate, 2-hydroxyethyl methacrylate, 2-hydroxypropyl acrylate, 2-hydroxypropyl methacrylate, ethylene glycol monoacrylate, ethylene glycol monomethacrylate, glycerol acrylate, glycerol methacrylate, dipentaerythritol monoacrylate, dipentaerythritol monomethacrylate, dimethylaminoethyl acrylate, dimethylaminoethyl methacrylate tetrahydrofurfuryl acrylate, tetrahydrofurfuryl methacrylate acrylamide, metliacrylamide, acrylonitrile, and methacrylonitrile. Especially preferred of these are methyl acrylate methyl methacrylate, ethyl acrylate, ethyl methacrylate butyl acrylate, butyl methacrylate, isobutyl acrylate, and isobutyl methacrylate.

Examples of the carboxylated cellulosic resin includ hydroxyethyl carboxymethyl cellulose and cellulose acetat phthalate. Especially preferred is cellulose acetate phthalate Cellulose acetate phthalate is well compatible with th urethane (meth)acrylate compound and has excellent film forming properties to give a dry film with satisfactory alkal developability.

Examples of the photopolymerization initiator of compo nent (C) in the present invention includ 1-hydroxycyclohexyl phenyl ketone, 2,2-dimethoxy-1,2 diphenylethan-1-one, 2-methyl-1-|4-(methylthio)phenyl|-2 morpholinopropan-1-one, 2-benzyl-2-dimethylamino-1-(4 morpholinophenyl)butan-1-one, 2-hydroxy-2-methyl-1 phenylpropan-1-one, 2,4,6 trimethylbenzoyldiphenylphosphine oxide, 1-|4-(2 hydroxyethoxy)phenyl|-2-hydroxy-2-methyl-1-propan-1 one, 2,4-diethylthioxanthone, 2-chlorothioxanthone, 2,4 dimethylthioxanthone, 3,3-dimethyl-4 methoxybenzophenone, benzophenone, 1-chloro-4 propoxythioxanthone, 1-(4-isopropylphenyl)-2-hydroxy-2 methylpropan-1-one, 1-(4-dodecylphenyl)-2-hydroxy-2 methylpropan-1-one, 4-benzoyl-4'-methyldimethyl sulfid 4-dimethylaminobenzoic acid, meth) 4-dimethylaminobenzoate, ethyl 4-dimethylaminobenzoat butyl 4-dimethylaminobenzoate, 2-ethylhex! 4-dimethylaminobenzoate, 2-isoam! 4-dimethylaminobenzoate, 2,2-diethoxyacetophenone, be zyl dimethyl ketal, benzyl β-methoxyethyl acetal, 1-phen) 1,2-propanedione 2-(o-ethoxycarbonyl)oxime, meth o-benzoylbenzoate, bis(4-dimethylaminophenyl) keton 4,4'-bisdiethylaminobenzophenone, 4,4 dichlorobenzophenone, benzil, benzoin, benzoin meth ether, benzoin ethyl ether, benzoin isopropyl ether, benzo n-butyl ether, benzoin isobutyl ether, benzoin butyl eth p-dimethylaminoacetophenone, p-tert-butyltrichloroacetophenone, p-tert-butyldichloroacetophenone, thioxanthone, 2-methylthioxanthone, 2-isopropylthioxanthone, dibenzosuberone, α,α-dichloro-4-phenoxyacetophenone, and pentyl 4-dimethylaminobenzoate. These compounds may be used alone or as a mixture of two or more thereof. The photopolymerization initiator may be contained in an amount of from 0.1 to 20 parts by weight per 100 parts by weight of the solid components of the photosensitive resin composition.

In the present invention, the ratio by weight of component (A) to component (B) is from 5/95 to 95/5, preferably from 10/90 to 85/15, and component (C) is used in an amount of from 0.1 to 20 parts by weight based on 100 parts by weight of the solid components of the photosensitive resin composition. The electrical insulation resistance (volume resistivity) of the photocured composition obtained from the photosensitive resin composition can be regulated to a value of from $8.0 \times 10^9$ to $1.0 \times 10^{14}$ Ω·cm, preferably from $8.0 \times 10^9$ to $1.0 \times 10^{13}$ Ω·cm, according to the above composition ratio and amount. If the electrical insulation resistance thereof exceeds $1.0 \times 10^{14}$ Ω·cm, the photocured composition is apt to suffer static build-up during sandblasting and a discharge or thunderbolt is apt to occur to damage the base. Although an electrical insulation resistance lower than $8.0 \times 10^9$ Ω·cm may be attained by adding a metal powder or the like, the addition of such an ingredient is undesirable in that this reduces sandblasting resistance and causes curing failure. If the amount of component (B) in the above ratio of (A)/(B) of the photosensitive resin composition exceeds 95% by weight, impaired blasting resistance results. If the amount thereof is lower than 5% by weight, the composition shows poor film-forming properties to pose problems concerning cold flow, and the like.

In addition to components (A) to (C) described above, the photosensitive resin composition of the present invention may contain component (D): a complex of an alkali thiocyanate with a polymer compound having a polyalkylene oxide segment. Due to the incorporation of component (D), the electrical insulation resistance (volume resistivity) of the photocured composition obtained from the photosensitive resin composition can be reduced to a value of from $1.0 \times 10^9$ to $1.0 \times 10^{12}$ Ω·cm, whereby damages caused by electrostatic discharges or thunderbolts can be prevented more effectively.

The values of electrical insulation resistance given above were obtained by applying the photosensitive resin composition to a glass-epoxy laminate on which a PZT wiring having a thickness of 45 μm, a line width of 625 μm, and a pitch of 1.825 μm had been formed, drying the coating to form a 50 μm-thick film, exposing the film to light with an extra-high pressure mercury lamp to cure the film, and measuring the electrical insulation resistance of the cured film with High Examples of the alkali thiocyanate in component (D) include lithium thiocyanate, sodium thiocyanate, potassium thiocyanate, rubidium thiocyanate, calcium thiocyanate, ammonium thiocyanate, cesium thiocyanate, magnesium thiocyanate, zinc thiocyanate, copper thiocyanato, and lead thiocyanate. Of these, sodium thiocyanate, magnesium thiocyanate, and ammonium thiocyanate are preferred because they are highly effective in inhibiting the increase of electrical insulation resistance. These thiocyanates are suitable for use in forming the variable and flattened film of a plasma display panel.

Examples of the polyalkylene oxide segment of the polymer compound containing the same include the segments represented by the following formulae:

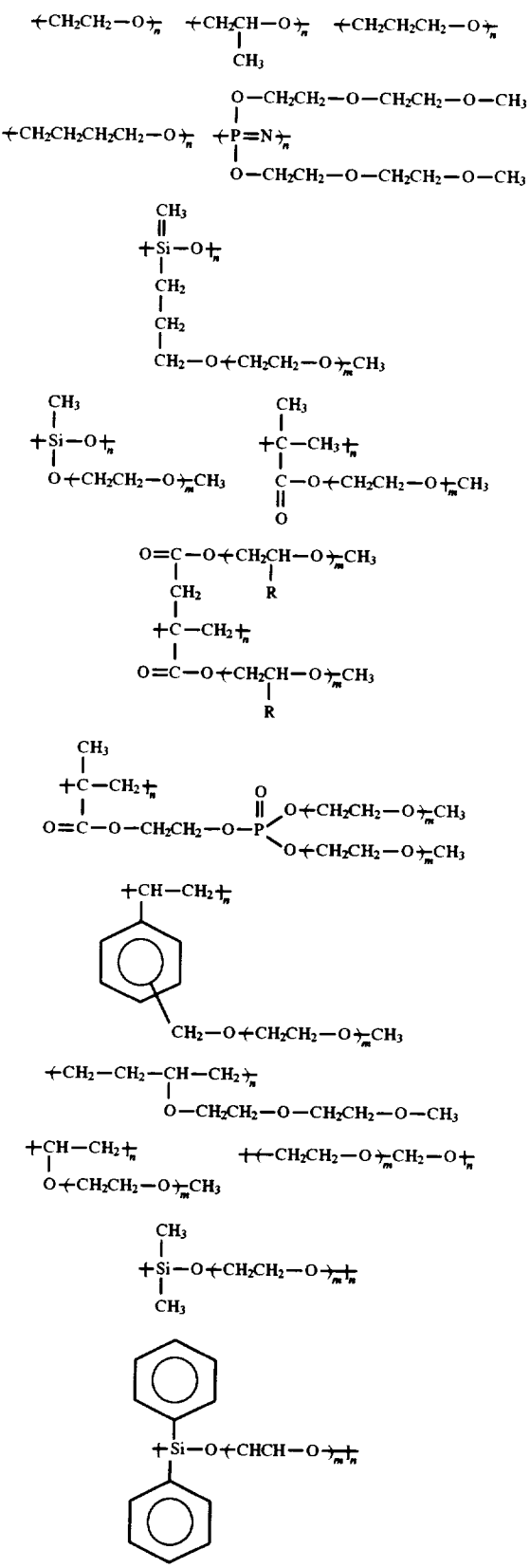

-continued

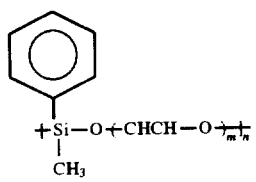

In the above formulae, R represents a hydrogen atom or an alkyl group having from 1 to 3 carbon atoms; m represents an integer of from 1 to 10; and n represents an integer of from 5 to 250.

In component (D), the proportion of the alkali thiocyanate to the polymer compound having a polyalkylene oxide segment is such that the amount of the alkali thiocyanate is from 0.001 to 1 part by weight based on one part by weight of the polymer compound having a polyalkylene oxide segment. If the proportion of the alkali thiocyanate is smaller than 0.001 part by weight, the desired effect cannot be attained. If the proportion thereof exceeds 1 part by weight, long-term storage stability is reduced. The amount of component (D) is preferably from 0.1 to 20 parts by weight based on 100 parts by weight of the total amount of components (A) to (C).

The incorporation of a Lewis acid salt which is soluble in an organic solvent and generates a Lewis acid upon light irradiation, as component (E), into the photosensitive resin composition comprising components (A) to (C) or (A) to (D) is effective in lowering the electrical insulation resistance to a value within the above-specified range. The Lewis acid salt functions to lower the electrical insulation resistance, usually from $10^{15}$ to $10^{18}$ Ω·cm, of a photocured composition obtained from a photosensitive resin composition to a value about from 1/10 to 1/1,000 of that value.

Examples of the Lewis acid salt include compounds represented by the following formulae:

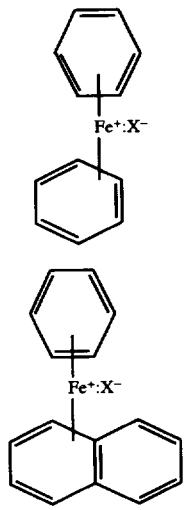

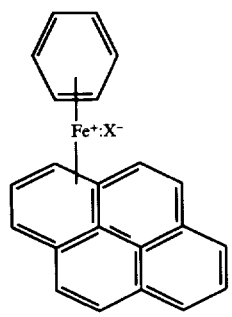

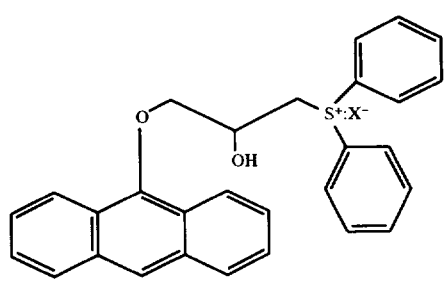

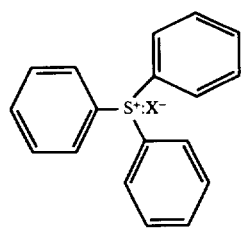

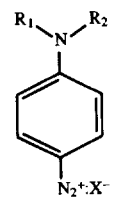

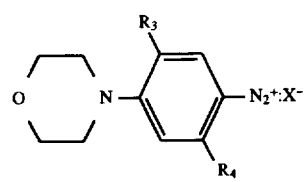

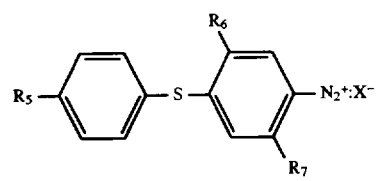

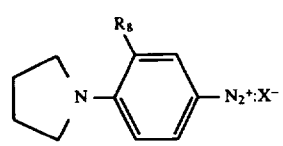

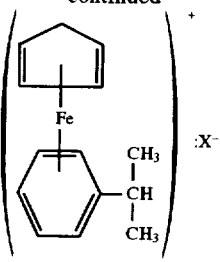

In the above formulae, $R_1$, $R_2$, $R_5$, and $R_8$ each represents an alkyl group having from 1 to 3 carbon atoms; $R_3$, $R_4$, $R_6$, and $R_7$ each represents an alkyl or alkoxy group having from 1 to 5 carbon atoms; and $X^-$ represents $BF_4^-$, $AsF_6^-$, $SbF_6^-$, or $PF_6^-$.

The Lewis acid salt is preferably used in an amount of from 0.05 to 10 parts by weight based on 100 parts by weight of the solid components of the photosensitive resin composition. If the amount thereof is lower than 0.05 parts by weight, the effect of lowing electrical insulation resistance is not obtained. If the amount thereof exceeds 10 parts by weight, storage stability is impaired.

If necessary, a photopolymerizable monomer may be incorporated in the photosensitive resin composition of the present invention in order to further improve sensitivity and to prevent the photocured film from undergoing a decrease in thickness or swelling during development. Examples of the photopolymerizable monomer include monofunctional monomers (monomers having a single functional group) such as acrylic acid, methacrylic acid, fumaric acid, maleic acid, monomethyl fumarate, monoethyl fumarate, 2-hydroxyethyl acrylate, 2-hydroxyethyl methacrylate, ethylene glycol monomethyl ether acrylate, and ethylene glycol nonomethyl ether methacrylate; and polyfunctional monomers (monomers having plural functional groups) such as trimethylolpropane triacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, and dipentaerythritol pentaacrylate. These compounds may be used alone or as a mixture of two or more thereof.

The incorporation amount of the photopolymerizable monomer is desirably up to 20 parts by weight based on 100 parts by weight of the urethane (meth)acrylate compound. If the amount thereof exceeds 20 parts by weight, not only the photosensitive resin composition gives a dry film which is apt to suffer cold flow, but also the cured film obtained from the photosensitive resin composition through ultraviolet irradiation has reduced elasticity and impaired sandblasting resistance.

In the case where the alkali-soluble polymer compound used in the photosensitive resin composition of the present invention is a copolymer of (meth)acrylic acid with a (meth)acrylic ester, the proportions of the components are preferably regulated especially in such a manner that the weight ratio of the urethane (meth)acrylate compound to the sum of the copolymer of (meth)acrylic acid with (meth) acrylic ester, and photopolymerizable monomer is from 5/95 to 95/5.

The composition of the present invention can be used in the form of a solution in a solvent. Examples of the solvent include ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, and 4-ethoxybutyl acetate. However, usable solvents are not limited to these examples.

Other ingredients which can be optionally added include dyes, polymerization inhibitors, electroconductive substances for regulating electrical insulation resistance, e.g., carbon and metal particles, and cationic, anionic, or amphoteric surfactants.

For applying the photosensitive resin composition of the present invention, suitable techniques may be used according to uses. For example, the composition in a liquid state may be applied as it is to a base, or applied to a base by screen printing. In technical fields where a precision processing is necessary as in the production of electronic parts, it is advantageous to use a photosensitive resin laminated film obtained by applying the photosensitive resin composition to a flexible support film and drying tile coating. Use of the photosensitive resin laminated film facilitates precise positioning and realizes high-precision engraving.

An example of the photosensitive resin laminated film is shown in FIG. 1. In FIG. 1, numeral 1 denotes a flexible support film, which is coated with a photosensitive resin composition layer 2 formed by applying the photosensitive resin composition of the present invention. This photosensitive resin composition layer 2 is covered tightly with a releasable film 3.

Since the flexible support film 1 serves to support the layer 2 of the photosensitive resin composition of the present invention, the thickness thereof is preferably from 15 to 125 µm. Examples of the film include films of synthetic resins such as polyethylene terephthalate, polyethylene, polypropylene, polycarbonates, and polyvinyl chloride. Of these, films of polyethylene terephthalate (PET) are especially preferred from the standpoints of flexibility and stiffness. The photosensitive resin composition layer 2 can be formed by dissolving the photosensitive resin composition into a solvent such as those enumerated hereinabove and applying tie resulting solution with an applicator, a bar coater, a roll coater, a curtain flow coater, or the like at a dry thickness of from 10 to 100 µm.

The releasable film 3 is a layer for stably protecting the photosensitive resin composition layer 2 until use. This releasable film should have such a moderate degree of releasability that the film can be easily stripped off at the time of use but it remains adherent until use. Preferred examples of the releasable film 3 include PET, polypropylene and polyethylene films about 15 to 125 µm thick which have a silicone coating layer formed through coating or baking.

A water-soluble resin layer may be formed between the flexible support film and the photosensitive resin composition layer in the photosensitive resin laminated film for the purposes of preventing desensitization by oxygen and preventing a mask pattern to be contacted with the photosensitive resin composition layer for exposure from adhering to the layer. The water-soluble resin layer is preferably a layer formed by applying a 5 to 20 wt % aqueous solution of a water-soluble polymer which is polyvinyl alcohol or a partially saponified polyvinyl acetate at a dry thickness of from 1 to 10 µm and drying the coating. Addition of ethylene glycol, propylene glycol, polyethylene glycol, or the like to the solution of a water-soluble polymer used for forming the water-soluble resin layer is preferred in that such an additive ingredient not only enhances the flexibility of the water-soluble resin layer but also improves the releasability thereof. In preparing the solution of a water-soluble polymer, it is possible to add methanol, ethylene glycol monomethyl ether, acetone, and a water-soluble antifoamer to improve the viscosity, non-foaming properties, and other properties of the solution.

Figure 2A:
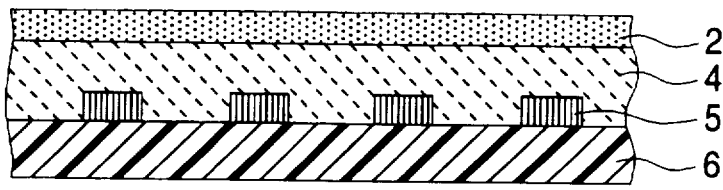
FIGS. 2A to 2E are views illustrating the procedure of a surface engraving method according to the present invention.
Figure 2B:
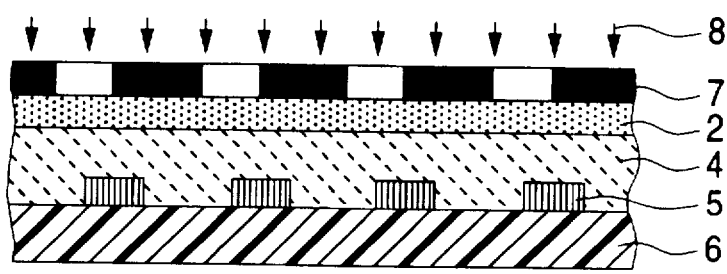
Figure 2C:
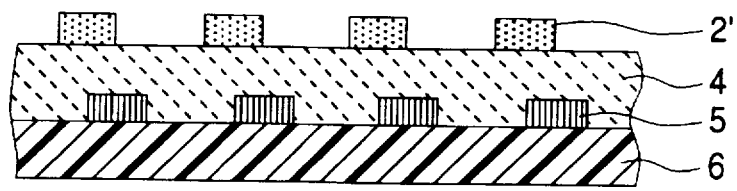
Figure 2D:
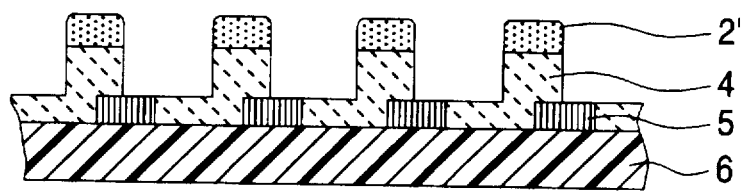

An example of preferred methods for using the photosensitive resin laminated film is shown in FIG. 2A to 2E. As shown in FIG. 2A, the releasable film 3 shown in FIG. 1 is stripped off and the exposed photosensitive resin composition layer is tightly adhered to a base 4. This adhesion is preferably conducted by the so-called thermocompression bonding method in which the base 4 is preheated and the dry film is placed thereon and pressed. After the pressing, the flexible support film 1 is stripped off. A mask 7 having a predetermined mask pattern is brought into close contact with the exposed photosensitive resin layer 2 as shown in FIG. 2B, and the resin layer 2 is exposed through the mask pattern to light with a low-pressure mercury lamp, high-pressure mercury lamp, extra-high pressure mercury lamp, arc lamp, xenon lamp, or the like. Besides ultraviolet rays, examples of radiations usable for the exposure include excimer lasers, x-rays, and electron rays. After the exposure, the mask pattern 7 is removed, and the resin layer 2 is developed. As a result of the development, those parts of the photosensitive resin layer 2 which have not been exposed to ultraviolet rays are removed, leaving only the exposed parts of the resin layer 2' as shown in FIG. 2C. For the development, a general-purpose alkali developing solution can be used as a developer. After the development, the base is sandblasted to engrave a design faithful to the pattern as shown in FIG. 2D. Preferred examples of the abrasive material used for sandblasting include fine inorganic particles of from 2 to 500 μm such as glass beads, SIC, $SiO_2$, $Al_2O_3$, and ZrO.

Figure 2E:
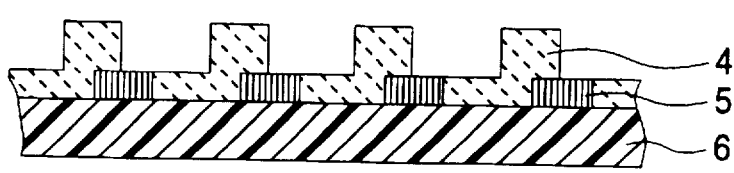

The residual resin layer 2' is removed from the sandblasted base by dissolving the resin layer into an aqueous alkali solution to form a design on the base surface as shown in FIG. 2E.

Examples of the present invention are given below by way of illustration and not by way of limitation. Unless otherwise indicated, all parts, percents, ratios and the like are by weight.

Measurement of Electrical Insulation Resistances of Urethane Acrylate Resins (i) Two parts by weight of 2,4-diethylthioxanthone was added to 40 parts by weight of carboxylated urethane acrylate "KRM 7222" (produced by Daicel Chemical Industies, Ltd.; weight-average molecular weight: 10,000; acid value: 20 mgKOH/kg; containing 20% ethyl acetate as a solvent. This composition was exposed to light, and the electrical insulation resistance of the resulting photocured composition was measured. As a result, the insulation resistance thereof was found to be $1.54 \times 10^{12}$ Ω·cm.

(ii) Two parts by weight of 2,4-diethylthioxanthone was added to 40 parts by weight of carboxylated urethane acrylate "Shiko UT-2313" (produced by The Nippon Synthetic Chemical Industry Co., Ltd.; weight-average molecular weight: about 10,000; acid value: 40 mgKOH/g; containing 30% ethyl acetate as a solvent). This composition was examined in the same manner. As a result, the electrical insulation resistance of the photocured composition was found to be $4.42 \times 10^{12}$ Ω·m.

EXAMPLE 1

Preparation of Photosensitive Resin Composition

A solution of a photosensitive resin composition (a) was prepared by sufficiently mixing the following compounds by stirring and kneading.

| | |
|---|---|
| Carboxylated urethane acrylate "KRM 7222" | 20 parts |
| Carboxylated urethane acrylate "Shiko UV-9510EA" (produced by The Nippon Synthetic Chemical Industry Co., Ltd.; weight-average molecular weight: about 20,000; acid value: 32 mgKOH/g; containing 30% ethyl acetate as solvent) | 40 parts |
| Cellulose acetate phthalate "KC-71" (produced by Wako Pure Chemical Industries, Ltd.; acid value: 120 mgKOH/g; containing 75% methyl ethyl ketone as solvent) | 40 parts |
| 2,4-Dimethylthioxanthone | 1 part |
| 2-Isoamyl 4-dimethylaminobenzoate | 1 part |
| Dimethyl benzyl ketal | 0.05 parts |
| Irgacure 500 (produced by Ciba-Geigy Ltd.; 1:1 (by weight) mixture of 1-hydroxycyclohexyl phenyl ketone and benzophenone) | 1 part |
| Ethyl acetate | 30 parts |

The photosensitive resin composition (a) prepared was examined for electrical insulation resistance after photocuring. As a result, the electrical insulation resistance thereof was found to be $5.20 \times 10^{13}$ Ω·cm.

The solution of the photosensitive resin composition (a) was applied to a polyethylene terephthalate (PET) support film in such an amount as to result in a dry film thickness of 50 μm, and the coating was dried to form a photosensitive resin composition layer. This photosensitive resin composition layer was covered with a PET releasable film to produce a photosensitive resin laminated film. The releasable film was stripped from the photosensitive resin laminated film and the exposed photosensitive resin composition layer was tightly adhered, with evacuation, to a plasma display panel which had been heated to 80° C. and the surface of which had been smoothed. Subsequently, the PET support film was stripped off, and a mask having 60 μm lines/spaces was brought into close contact with the exposed photosensitive resin composition layer. The photosensitive resin composition layer was exposed to light through the mask with an extra-high pressure mercury lamp in an exposure dose o 200 mJ/cm². After the exposure, the resin composition laye was developed with a 0.2% aqueous sodium carbonat solution at a spray pressure of 1.5 kg/cm². The plasm display panel was then sandblasted with glass beads #800 a an abrasive material for 180 seconds at a blast pressure of kg/cm². Although a discharge phenomenon was observe during the sandblasting, an examination of the resultin sandblasted plasma display panel revealed that the base ha no damage and the decrease in film thickness of the resi pattern was little.

Comparative Example 1

Preparation of Photosensitive Resin Composition

A solution of a photosensitive resin composition (b) wa prepared by sufficiently mixing the following compounds t stirring and kneading.

| | |
|---|---|
| Carboxylated urethane acrylate "KRM 7222" | 35 parts |
| Carboxylated urethane acrylate | 28 parts |

-continued

| | |
|---|---|
| "Shiko UV-3000 K80" (produced by The Nippon Synthetic Chemical Industry Co., Ltd.; weight-average molecular weight: about 20,000; acid value: 0 mgKOH/g; containing 20% methyl ethyl ketone as a solvent) | |
| Cellulose acetate phthalate "KC-71" | 40 parts |
| 2,4-Dimethylthioxanthone | 2 parts |
| 2-Isoamyl 4-dimethylaminobenzoate | 1 part |
| Dimethyl benzyl ketal | 0.05 parts |
| Ethyl acetate | 30 parts |

The photosensitive resin composition (b) prepared was examined for electrical insulation resistance after photocuring in the same manner as in Example 1. As a result, the electrical insulation resistance thereof was found to be $1.23 \times 10^{14}$ $\Omega$·cm.

The solution of the photosensitive resin composition (b) was then formed into a dry film and used for the abrasion of the insulation layer of a plasma display panel in the same manner as in Example 1, as follows. The photosensitive resin composition (b) was applied to a PET support film in such an amount as to result in a dry film thickness of 50 µm, and the coating was dried to form a photosensitive resin composition layer. This photosensitive resin composition layer was covered with a PET releasable film to produce a photosensitive resin laminated film. The releasable film was stripped from the photosensitive resin laminated film, and the exposed photosensitive resin composition layer was tightly adhered, with evacuation, to a plasma display panel which had been heated to 80° C. and the surface of which had been smoothed. Subsequently, the PET support film was stripped off, and a mask having 60 µm lines/spaces was brought into close contact with the exposed photosensitive resin composition layer. The photosensitive resin composition layer was exposed to light through the mask with an extra-high pressure mercury lamp in an exposure dose of 200 mJ/cm$^2$. After the exposure, the resin composition layer was developed with a 0.2% aqueous sodium carbonate solution at a spray pressure of 1.5 kg/cm$^2$. The plasma display panel was then sandblasted with glass beads #800 as an abrasive material for 180 seconds at a blast pressure of 4 kg/cm$^2$. Although the decrease in film thickness was little as in Example 1, the plasma display panel had suffered a damage caused by discharges (the glass had electrostatically formed through-holes).

EXAMPLE 2

A solution of a photosensitive resin composition (c) was prepared by sufficiently mixing compounds by stirring and kneading in the same manner as in Example 1, except that 0.5 parts by weight of 4-morpholino-2,5-dibutoxybenzenediazonium hexafluorophosphate was further added.

The photosensitive resin composition (c) prepared was examined for electrical insulation resistance after photocuring in the same manner as in Example 1. As a result, the electrical insulation resistance thereof was found to be $2.60 \times 10^{11}$ $\Omega$·cm.

The solution of the photosensitive resin composition (c) was then formed into a dry film and used for the abrasion of the insulation layer of a plasma display panel in the same manner as in Example 1, as follows. The photosensitive resin composition (c) was applied to a PET support film in such an amount as to result in a dry film thickness of 50 µm, and the coating was dried to form a photosensitive resin composition layer. This photosensitive resin composition layer was covered with a PET releasable film to produce a photosensitive resin laminated film. The releasable film was stripped from the photosensitive resin laminated film, and the exposed photosensitive resin composition layer was tightly adhered, with evacuation, to a plasma display panel which had been heated to 80° C. and the surface of which had been smoothed. Subsequently, the PET support film was stripped off, and a mask having 60 µm lines/spaces was brought into close contact with the exposed photosensitive resin composition layer. The photosensitive resin composition layer was exposed to light through the mask with an extra-high pressure mercury lamp in an exposure dose of 200 mJ/cm$^2$. After the exposure, the resin composition layer was developed with a 0.2% aqueous sodium carbonate solution at a spray pressure of 1.5 kg/cm$^2$. The plasma display panel was then sandblasted with glass beads #800 as an abrasive material for 180 seconds at a blast pressure of 4 kg/cm$^2$. A discharge phenomenon was not observed at all during the sandblasting, and an examination of the resulting sandblasted plasma display panel revealed that the base had no damage and the decrease in film thickness of the resist pattern was little. Thus, the resist showed excellent performances.

EXAMPLE 3

A solution of a photosensitive resin composition (d) was prepared by sufficiently mixing compounds by stirring and kneading in the same manner as in Comparative Example 1, except that 1 part by weight of Irgacure 261 (produced by Ciba-Geigy Ltd.; ($\eta^5$-2,4-cyclopentadien-1-yl) [(1,2,3,4,5,6-$\eta$)-(1-methylethyl)benzene]iron(1+) hexafluorophosphate (1−)) was further added.

The photosensitive resin composition (d) prepared was examined for electrical insulation resistance after photocuring in the same manner as in Example 1. As a result, the electrical insulation resistance thereof was found to be $1.58 \times 10^{12}$ $\Omega$·cm.

The solution of the photosensitive resin composition (d) was then formed into a dry film and used for tile abrasion of the insulation layer of a plasma display panel in the same manner as in Example 1, as follows. The photosensitive resin composition (d) was applied to a PET support film in such an amount as to result in a dry film thickness of 50 µm, and the coating was dried to form a photosensitive resin composition layer. This photosensitive resin composition layer was covered with a PET releasable film to produce a photosensitive resin laminated film. The releasable film was stripped from the photosensitive resin laminated film, and the exposed photosensitive resin composition layer was tightly adhered, with evacuation, to a plasma display panel which had been heated to 80° C. and the surface of which had been smoothed. Subsequently, the PET support film was stripped off, and a mask having 60 µm lines/spaces was brought into close contact with the exposed photosensitive resin composition layer. The photosensitive resin composition layer was exposed to light through the mask with an extra-high pressure mercury lamp in an exposure dose of 200 mJ/cm$^2$. After the exposure, the resin composition layer was developed with a 0.2% aqueous sodium carbonate solution at a spray pressure of 1.5 kg/cm$^2$. The plasma display panel was then sandblasted with glass beads #800 as an abrasive material for 180 seconds at a blast pressure of 4 kg/cm$^2$. A discharge phenomenon was not observed at all during the sandblasting, and an examination of the resulting sandblasted plasma display panel revealed that the base had no damage and the decrease in film thickness of the resist pattern was little. Thus, the resist showed excellent performances.

EXAMPLE 4

The photosensitive resin composition (c) prepared was used in relief engraving by sandblasting to form a decorative design on a glass plate.

First, a transparent glass plate having dimensions of 35 cm×25 cm with a thickness of 5 mm was coated with the above-described photosensitive resin composition (c) using a bar coater in such an amount as to result in a dry film thickness of 60 μm. The coating was dried to form a photosensitive resin composition layer. This resin composition layer was subjected to projection exposure to light through a negative mask bearing a decorative design with an extra-high pressure mercury lamp in an exposure dose of 200 mJ/cm². Thereafter, the resin composition layer was developed with a 0.2% aqueous sodium carbonate solution at a spray pressure of 1.5 kg/cm².

Sandblasting was then conducted for 250 seconds using alumina #200 as an abrasive material at a blast pressure of 4 kg/cm². A discharge phenomenon was not observed at all during sandblasting, and an examination of the resulting sandblasted glass plate revealed that the base had no damage and the decrease in film thickness of the resist pattern was little. Thus, the resist showed excellent performances.

EXAMPLE 5

Preparation of Photosensitive Resin Composition

A solution of a photosensitive resin composition (e) was prepared by sufficiently mixing the following compounds by stirring and kneading.

| | |
|---|---|
| Carboxylated urethane acrylate "KRM 7222" | 35 parts |
| Carboxylated urethane acrylate "UA-T01" (produced by Shin-Nakamura Chemical Co., Ltd.; weight-average molecular weight: about 3,000; acid value: 34 mgKOH/g; containing 30% ethyl acetate as solvent) | 40 parts |
| Cellulose acetate phthalate "KC-71" | 30 parts |
| 2,4-Dimethylthioxanthone | 2 parts |
| 2-Isoamyl 4-dimethylaminobenzoate | 1 part |
| Dimethyl benzyl ketal | 0.05 parts |
| Irgacure 261 | 0.1 parts |
| Ethyl acetate | 30 parts |

The photosensitive resin composition (e) prepared was examined for electrical insulation resistance after photocuring in the same manner as in Example 1. As a result, the electrical insulation resistance thereof was found to be $8.66 \times 10^{10}$ Ω·cm.

The solution of the photosensitive resin composition (e) was then formed into a dry film and used for the abrasion of the insulation layer of a plasma display panel in the same manner as in Example 1, as follows. The photosensitive resin composition (e) was applied to a PET support film in such an amount as to result in a dry film thickness of 50 μm, and the coating was dried to form a photosensitive resin composition layer. This photosensitive resin composition layer was covered with a PET releasable film to produce a photosensitive resin laminated film. The releasable film was stripped from the photosensitive resin laminated film, and the exposed photosensitive resin composition layer was tightly adhered, with evacuation, to a plasma display panel which had been heated to 80° C. and the surface of which had been smoothed. Subsequently, the PET support film was stripped off, and a mask having 60 μm lines/spaces was brought into close contact with the exposed photosensitive resin composition layer. The photosensitive resin composition layer was exposed to light through the mask with an extra-high pressure mercury lamp in an exposure dose of 200 mJ/cm². After the exposure, the resin composition layer was developed with a 0.2% aqueous sodium carbonate solution at a spray pressure of 1.5 kg/cm². The plasma display panel was then sandblasted with glass beads #800 as an abrasive material for 180 seconds at a blast pressure of 4 kg/cm². Although a discharge phenomenon was observed during the sandblasting, an examination of the resulting sandblasted plasma display panel revealed that the base had no damage and the decrease in film thickness of the resist pattern was little.

EXAMPLE 6

Preparation of Photosensitive Resin Composition

A solution of a photosensitive resin composition was prepared by sufficiently mixing the following compounds by stirring and kneading.

| | |
|---|---|
| Carboxylated urethane acrylate "KRM 7222" | 35 parts |
| Carboxylated urethane acrylate "Shiko UT-9510" | 32 parts |
| Cellulose acetate phthalate "KC-71" | 30 parts |
| 2,4-Dimethylthioxanthone | 2 parts |
| 2-Isoamyl 4-dimethylaminobenzoate | 1 part |
| Dimethyl benzyl ketal | 0.05 parts |
| Polyethylene oxide ammonium thiocyanate complex (molecular weight of polyethylene oxide: about 5,000; polyethylene oxide/ammonium thiocyanate weight ratio: 1/0.05) | 3 parts |
| Ethyl acetate | 30 parts |

The photosensitive resin composition prepared was examined for electrical insulation resistance after photocuring. As a result, the electrical insulation resistance thereof was found to be $3.47 \times 10^{10}$ Ω·cm in terms of volume resistivity.

The solution of the photosensitive resin composition was applied to a polyethylene terephthalate (PET) support film in such an amount as to result in a dry film thickness of 50 μm, and the coating was dried to form a photosensitive resin composition layer. This photosensitive resin composition layer was covered with a PET releasable film to produce a photosensitive resin laminated film. The releasable film was stripped from the photosensitive resin laminated film, and the exposed photosensitive resin composition layer was thermocompression-bonded to a glass base at 80° C. Subsequently, the PET support film was stripped off, and a mask having 60 μm lines/spaces was brought into close contact with the exposed photosensitive resin composition layer. The photosensitive resin composition layer was exposed to light through the mask with an extra-high pressure mercury lamp in an exposure dose of 100 mJ/cm². After the exposure, the resin composition layer was developed with a 0.2% aqueous sodium carbonate solution at a spray pressure of 1.5 kg/cm². The glass base was then sandblasted with abrasive glass beads #800 for 180 seconds at a blast pressure of 4 kg/cm² using the obtained resist pattern as a mask. An examination of the resulting sandblasted glass base revealed that the base had no damage at all and the decrease in film thickness of the resist pattern was little.

EXAMPLE 7

Preparation of Photosensitive Resin Composition

A solution of a photosensitive resin composition wa prepared by sufficiently mixing the following compounds b stirring and kneading.

| | |
|---|---|
| Carboxylated urethane acrylate "KRM 7222" | 35 parts |
| Carboxylated urethane acrylate "Shiko UT-9510" | 32 parts |
| Cellulose acetate phthalate "KC-71" | 30 parts |
| 2,4-Dimethylthioxanthone | 2 parts |
| 2-Isoamyl 4-dimethylaminobenzoate | 1 part |
| Dimethyl benzyl ketal | 0.05 parts |

-continued

| | |
|---|---|
| Complex of a polymer having a polyalkylene oxide segment represented by | 3 parts |

$$+CH_2-CH_2-CH-CH_2+_n$$
$$\quad\quad\quad\quad\quad |$$
$$\quad\quad\quad\quad O-CH_2CH_2-O-CH_2CH_2-O-CH_3$$

with sodium thiocyanate
(molecular weight of the polymer having
polyalkylene oxide segment: about 6,000;
weight ratio of the polymer having polyalkylene
oxide segment to sodium thiocyanate: 1/0.005)

| | |
|---|---|
| Ethyl acetate | 30 parts |

The photosensitive resin composition prepared was examined for electrical insulation resistance after photocuring. As a result, the electrical insulation resistance thereof was found to be $8.86 \times 10^{11}$ Ω·cm in terms of volume resistivity.

The solution of the photosensitive resin composition was formed into a photosensitive laminated film in the same manner as in Example 6. The releasable film was then stripped off, and the exposed layer was thermocompression-bonded to a glass base at 80° C. to form a photosensitive resin composition layer. Subsequently, the PET support film was stripped off, and a mask capable of reproducing 60 μm lines/spaces was brought into close contact with the exposed photosensitive resin composition layer. The photosensitive resin composition layer was exposed to light and developed in the same manner as in Example 6 to form a mask pattern. The glass base was then sandblasted with glass beads #800 for 180 second at a blast pressure of 4 kg/cm². During the sandblasting, a phenomenon such as a discharge or thunderbolt was not observed on the glass base at all. Furthermore, the sandblasted glass base had no damage at all, and the resist pattern had undergone no decrease in film thickness.

EXAMPLE 8
Preparation of Photosensitive Resin Composition

A solution of a photosensitive resin composition was prepared by sufficiently mixing the following compounds by stirring and kneading.

| | |
|---|---|
| Carboxylated urethane acrylate "KRM 7222" | 35 parts |
| Carboxylated urethane acrylate "Shiko UT-9510" | 32 parts |
| Cellulose acetate phthalate "KC-71" | 30 parts |
| 2,4-Dimethylthioxanthone | 2 parts |
| 2-Isoamyl 4-dimethylaminobenzoate | 1 part |
| Dimethyl benzyl ketal | 0.05 parts |
| Complex of a polymer having a polyalkylene oxide segment represented by | 2.5 parts |

$$+CH_2CH-O+_n$$
$$\quad\quad |$$
$$\quad\quad CH_3$$

with magnesium thiocyanate
(molecular weight of the polymer having
polyalkylene oxide segment: about 5,500;
weight ratio of the polymer having polyalkylene
oxide segment to magnesium thiocyanate: 1/0.5)

| | |
|---|---|
| Ethyl acetate | 30 parts |

The photosensitive resin composition prepared was examined for electrical insulation resistance after photocuring. As a result, the electrical insulation resistance thereof was found to be $5.29 \times 10^9$ Ω·cm in terms of volume resistivity.

The solution of the photosensitive resin composition was formed into a photosensitive laminated film in the same manner as in Example 6. The releasable film was then stripped off, and the exposed layer was thermocompression-bonded to a glass base at 80° C. to form a photosensitive resin composition layer. Subsequently, the PET support film was stripped off, and a mask capable of reproducing 60 μm lines/spaces was brought into close contact with the exposed photosensitive resin composition layer. The photosensitive resin composition layer was exposed to light and developed in the same manner as in Example 6 to form a mask pattern. The glass base was then sandblasted with glass beads #800 for 180 seconds at a blast pressure of 4 kg/cm². During the sandblasting, a phenomenon such as a discharge or thunderbolt was not observed on the glass base at all. Furthermore, the sandblasted glass base had no damage at all, and the resist pattern had undergone no decrease in film thickness.

Comparative Example 2
Preparation of Photosensitive Resin Composition

A solution of a photosensitive resin composition was prepared by sufficiently mixing the following compounds by stirring and kneading.

| | |
|---|---|
| Carboxylated urethane acrylate "KRM 7222" | 35 parts |
| Carboxylated urethane acrylate "Shiko UT-9510" | 32 parts |
| Cellulose acetate phthalate "KC-71" | 30 parts |
| 2,4-Dimethylthioxanthone | 2 parts |
| 2-Isoamyl 4-dimethylaminobenzoate | 1 part |
| Dimethyl benzyl ketal | 0.05 parts |

The photosensitive resin composition prepared was examined for electrical insulation resistance after photocuring. As a result, the electrical insulation resistance thereof was found to be $1.23 \times 10^{14}$ Ω·cm in terms of volume resistivity.

The solution of the photosensitive resin composition was formed into a photosensitive laminated film in the same manner as in Example 6. The releasable film was then stripped off, and the exposed layer was thermocompression-bonded to a glass base at 80° C. to form a photosensitive resin composition layer. Subsequently, the PET support film was stripped off, and a mask capable of reproducing 60 μm lines/spaces was brought into close contact with the exposed photosensitive resin composition layer. The photosensitive resign composition layer was exposed to light and developed in the same manner as in Example 6 to form a mask pattern. The glass base was then sandblasted with glass beads #800 for 180 seconds at a blast pressure of 4 kg/cm². During the sandblasting, discharges and thunderbolts were observed on the glass base. The sandblasted glass base had through-holes formed by discharges.

EXAMPLE 9
Preparation of Photosensitive Resin Composition

A solution of a photosensitive resin composition was prepared by sufficiently mixing the following compounds by stirring and kneading.

| | |
|---|---|
| Carboxylated urethane acrylate "KRM 7222" | 35 parts |
| Carboxylated urethane acrylate "Shiko UT-9510" | 32 parts |
| Cellulose acetate phthalate "KC-71" | 30 parts |
| 2,4-Dimethylthioxanthone | 2 parts |
| 2-Isoamyl 4-dimethylaminobenzoate | 1 part |
| Dimethyl benzyl ketal | 0.05 parts |
| Polyethylene oxide-ammonium thiocyanate complex (molecular weight of the polymer having polyalkylene oxide segment: about 5,000; polyethylene oxide/ammonium thiocyanate weight ratio: 1/0.05) | 2 parts |
| Ethyl acetate | 30 parts |

The photosensitive resin composition prepared was examined for electrical insulation resistance after photocuring. As a result, the electrical insulation resistance thereof was found to be $2.75 \times 10^{10}$ Ω·cm in terms of volume resistivity.

The solution of the photosensitive resin composition was formed into a photosensitive laminated film in the same manner as in Example 6. The releasable film was then stripped off, and the exposed layer was thermocompression-bonded to a glass base at 80° C. to form a photosensitive resin composition layer. Subsequently, the PET support film was stripped off, and a mask capable of reproducing 60 μm lines/spaces was brought into close contact with the exposed photosensitive resin composition layer. The photosensitive resin composition layer was exposed to light and developed in the same manner as in Example 6 to form a mask pattern. The glass base was then sandblasted with glass beads #800 for 180 seconds at a blast pressure of 4 kg/cm$^2$. During the sandblasting, a phenomenon such as a discharge or thunderbolt was not observed on the glass base at all. Furthermore, the sandblasted glass base had no damage at all, and the resist pattern had undergone no decrease in film thickness.

EXAMPLE 10

Preparation of Photosensitive Resin Composition

A solution of a photosensitive resin composition was prepared by sufficiently mixing the following compounds by stirring and kneading.

| | |
|---|---|
| Carboxylated urethane acrylate "KRM 7222" | 35 parts |
| Carboxylated urethane acrylate "Shiko UT-9510" | 32 parts |
| Cellulose acetate phthalate "KC-71" | 30 parts |
| 2,4-Dimethylthioxanthone | 2 parts |
| 2-Isoamyl 4-dimethylaminobenzoate | 1 part |
| Dimethyl benzyl ketal | 0.05 parts |
| Polyethylene oxide-ammonium thiocyanate complex (molecular weight of the polymer having polyalkylene oxide segment: about 5,000; polyethylene oxide/ammonium thiocyanate weight ratio: 1/0.05) | 2 parts |
| 4-Morpholino-2,5-dibutoxybenzenediazonium hexafluorophosphate | 0.5 parts |
| Ethyl acetate | 30 parts |

The photosensitive resin composition prepared was examined for electrical insulation resistance after photocuring. As a result, the electrical insulation resistance thereof was found to be 3.82×10$^9$ Ω·cm in terms of volume resistivity.

The solution of the photosensitive resin composition was formed into a photosensitive laminated film in the same manner as in Example 6. The releasable film was then stripped off, and the exposed layer was thermocompression-bonded to a glass base at 80° C. to form a photosensitive resin composition layer. Subsequently, the PET support film was stripped off, and a mask capable of reproducing 60 μm lines/spaces was brought into close contact with the exposed photosensitive resin composition layer. The photosensitive resin composition layer was exposed to light and developed in the same manner as in Example 6 to form a mask pattern. The glass base was then sandblasted with glass beads #800 for 180 seconds at a blast pressure of 4 kg/cm$^2$. During the sandblasting, a phenomenon such as a discharge or thunderbolt was not observed on the glass base at all. Furthermore, the sandblasted glass base had no damage at all, and the resist pattern had undergone no decrease in film thickness.

As shown in the above examples, the photosensitive resin composition of the present invention has high sensitivity and gives a photocured composition having high sandblasting resistance. Furthermore, since the photocured composition is less apt to suffer static build-up, the base which is being sandblasted is not damaged by a discharge or thunderbolt caused by accumulated static electricity. In particular, use of a photosensitive resin laminated film formed losing the photosensitive resin composition of the present invention is effective in conducting a fine processing of electronic parts and other works without causing an electrostatic discharge or thunderbolt, whereby products can be produced in good yield.

While the invention has been described in detail and with reference to specific embodiments thereof, it will be apparent to one skilled in the art that various changes and modifications can be made therein without departing from the spirit and scope thereof.

What is claimed is:

1. A photosensitive resin composition comprising the following components (A), (B), (C) and (D):

(A) a photopolymerizable urethane (meth)acrylate compound containing at least two acryloyl or methacryloyl groups, (B) an alkali-soluble polymer having an acid value of from 50 to 250 mgKOH/g, (C) a photopolymerization initiator, and (D) a complex of an alkali thiocyanate with a polymer having a polyalkylene oxide segment, wherein said photosensitive resin composition has an electrical insulation resistance of 8.0×10$^9$ to 1.0× 10$^{14}$ Ω·cm after photocuring.

2. The photosensitive resin composition as claimed in claim 1, which has an electrical insulation resistance of from 8.0×10$^9$ to 10×10$^{13}$ Ω·cm after photocuring.

3. The photosensitive resin composition as claimed in claim 2, wherein said alkali thiocyanate is selected from the group consisting of ammonium thiocyanate, sodium thiocyanate, and magnesium thiocyanate.

4. The photosensitive resin composition as claimed in claim 1, wherein the ratio by weight of said components (A) and (B) is from 5:95 to 95:5, and said component (C) is contained in an amount of from 0.1 to 20 parts by weight based on 100 parts by weight of the solid components of said photosensitive resin composition.

5. The photosensitive resin composition as claimed in claim 1, wherein said component (D) is contained in an amount of from 0.1 to 20 parts by weight based on 100 parts by weight of said components (A), (B) and (C).

6. The photosensitive resin composition as claimed in claim 1, wherein said photosensitive resin composition is used for sandblasting.

7. A photosensitive resin composition comprising the following components (A), (B), (C) and (E):

(A) a photopolymerizable urethane (meth)acrylate compound containing at least two acryloyl or methacryloyl groups, (B) an alkali-soluble polymer having an acid value of from 50 to 250 mgKOH/g, (C) a photopolymerization initiator, and (E) a Lewis acid salt which is soluble in an organic solvent and generates a Lewis acid upon light irradiation, wherein said photosensitive resin composition has a electrical insulation resistance of 8.0×10$^9$ to 1.0 10$^{14}$ Ω·cm after photocuring.

8. The photosensitive resin composition as claimed i claim 7, which has an electrical insulation resistance of fro 8.0×10$^9$ to 1.0×10$^{13}$ Ω·cm after photocuring.

9. The photosensitive resin composition as claimed claim 7, wherein the ratio by weight of said components (A and (B) is from 5:95 to 95:5, and said component (C) contained in an amount of from 0.1 to 20 parts by weig based on 100 parts by weight of the solid components of sa photosensitive resin composition.

10. The photosensitive resin composition as claimed in claim 7, wherein said component (E) is contained in an amount of from 0.05 to 10 parts by weight based on 100 parts by weight of the solid components of said photosensitive resin composition.

11. The photosensitive resin composition as claimed in claim 7, wherein said photosensitive resin composition is used for sandblasting.

12. A photosensitive resin composition comprising the following components (A), (B), (C), (D) and (E):

(A) a photopolymerizable urethane (meth)acrylate compound containing at least two acryloyl or methacryloyl groups, (B) an alkali-soluble polymer having an acid value of from 50 to 250 mgKOH/g, (C) a photopolymerization initiator, (D) a complex of an alkali thiocyanate with a polymer having a polyalkylene oxide segment, and (E) a Lewis acid salt which is soluble in an organic solvent and generates a Lewis acid upon light irradiation, wherein said photosensitive resin composition has an electrical insulation resistance of $8.0 \times 10^9$ to $1.0 \times 10^{14}$ $\Omega \cdot$cm after photocuring.

13. The photosensitive resin composition as claimed in claim 12, which has an electrical insulation resistance of from $8.0 \times 10^9$ to $1.0 \times 10^{13}$ $\Omega \cdot$cm after photocuring.

14. The photosensitive resin composition as claimed in claim 12, wherein the ratio by weight of said components (A) and (B) is from 5:95 to 95:5, and said component (C) is contained in an amount of from 0.1 to 20 parts by weight based on 100 parts by weight of the solid components of said photosensitive resin composition.

15. The photosensitive resin composition as claimed in claim 12, wherein said component (E) is contained in an amount of from 0.05 to 10 parts by weight based on 100 parts by weight of the solid components of said photosensitive resin composition.

16. The photosensitive resin composition as claimed in claim 12, wherein said photosensitive resin composition is used for sandblasting.

17. The photosensitive resin composition as claimed in claim 12, wherein said alkali thiocyanate is selected from the group consisting of ammonium thiocyanate, sodium thiocyanate, and magnesium thiocyanate.

18. The photosensitive resin composition as claimed in claim 12, wherein said component (D) is contained in an amount of from 0.1 to 20 parts by weight based on 100 parts by weight of said components (A), (B) and (C).

* * * * *